United States Patent
Enichlmair et al.

(10) Patent No.: US 8,796,743 B2
(45) Date of Patent: Aug. 5, 2014

(54) LIGHT-SENSITIVE COMPONENT

(75) Inventors: Hubert Enichlmair, Graz (AT); Jochen Kraft, Oberaich (AT); Georg Röhrer, Graz (AT)

(73) Assignee: AMS AG, Unterpremstätten (AT)

( * ) Notice: Subject to any disclaimer, the term of this patent is extended or adjusted under 35 U.S.C. 154(b) by 972 days.

(21) Appl. No.: 11/884,642

(22) PCT Filed: Jan. 26, 2006

(86) PCT No.: PCT/EP2006/000696
§ 371 (c)(1),
(2), (4) Date: May 28, 2008

(87) PCT Pub. No.: WO2006/087080
PCT Pub. Date: Aug. 24, 2006

(65) Prior Publication Data
US 2008/0272413 A1 Nov. 6, 2008

(30) Foreign Application Priority Data
Feb. 17, 2005 (DE) .................... 10 2005 007 358

(51) Int. Cl.
*H01L 27/148* (2006.01)

(52) U.S. Cl.
USPC .................... 257/233; 257/292; 257/E31.063

(58) Field of Classification Search
USPC .......... 257/233, 292, 431, E31.063, E31.058, 257/118, E51.026, E51.012, E33.077, 257/E33.054, E31.054, E31.086, E31.092, 257/E31.096, E27.12, E27.122; 438/48, 65
See application file for complete search history.

(56) References Cited

U.S. PATENT DOCUMENTS

| | | | |
|---|---|---|---|
| 3,459,944 A | 8/1969 | Triebwasser | |
| 3,601,668 A | 8/1971 | Slaten et al. | |
| 3,714,522 A | * 1/1973 | Komiya et al. | 359/321 |
| 4,021,834 A | * 5/1977 | Epstein et al. | 385/130 |
| 4,057,819 A | 11/1977 | Owen et al. | |
| 4,107,722 A | 8/1978 | Chamerlain | |
| 4,148,051 A | 4/1979 | Koike et al. | |
| 4,348,690 A | * 9/1982 | Jastrzebski et al. | 348/282 |
| 4,608,587 A | * 8/1986 | Nishizawa | 257/258 |
| 4,968,634 A | 11/1990 | Kuhlmann | |

(Continued)

FOREIGN PATENT DOCUMENTS

| | | |
|---|---|---|
| JP | 51-000285 | 1/1976 |
| JP | 63 202062 A | 8/1988 |

OTHER PUBLICATIONS

Examiner Report dated Jun. 21, 2007 issued for the corresponding European Application No. 10 2005 007 358.1.

*Primary Examiner* — Cuong Q Nguyen
*Assistant Examiner* — Yosef Gebreyesus
(74) *Attorney, Agent, or Firm* — McDermott Will & Emery LLP

(57) ABSTRACT

In order to detect light with in particular a high blue component, the inversion zone and the space charge zone of a CMOS-like structure are used. In conjunction with an at least partly transparent gate electrode, in particular a transparent conductive oxide or a patterned gate electrode, it becomes possible to absorb the short-wave component of incident light within the inversion zone and to reliably conduct away the generated charge carrier pairs to first and second contacts. During operation, a control voltage is applied to the gate electrode with a magnitude that generates a continuous inversion zone below the optionally patterned gate electrode.

9 Claims, 3 Drawing Sheets

(56) References Cited

U.S. PATENT DOCUMENTS

| | | |
|---|---|---|
| 5,200,634 A | 4/1993 | Tsukada et al. |
| 5,449,931 A * | 9/1995 | Peek et al. ............... 257/231 |
| 6,051,857 A * | 4/2000 | Miida ....................... 257/292 |
| 6,306,679 B1 | 10/2001 | Kang et al. |
| 6,512,280 B2 | 1/2003 | Chen et al. |
| 6,580,109 B1 * | 6/2003 | Thomas et al. ........... 257/292 |
| 7,671,391 B2 * | 3/2010 | Kawahito ................. 257/290 |
| 2003/0042494 A1 * | 3/2003 | Worley ...................... 257/98 |
| 2003/0143786 A1 | 7/2003 | Thomas et al. |
| 2004/0239787 A1 * | 12/2004 | Kawasaki ................. 348/294 |

\* cited by examiner

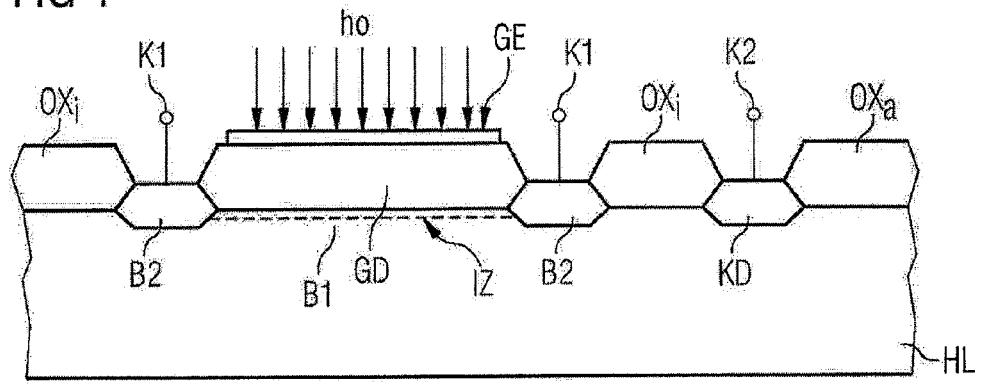
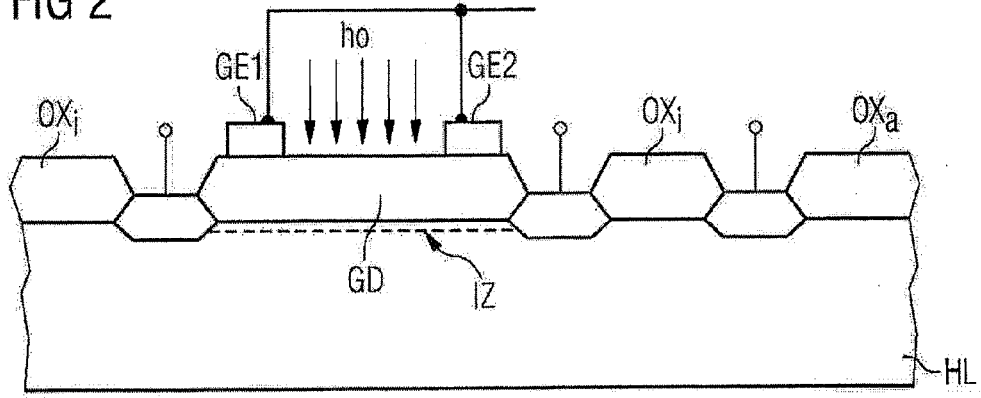

ately 460 nm has only a small penetration depth into
LIGHT-SENSITIVE COMPONENT

RELATED APPLICATIONS

This is a U.S. national stage of application No. PCT/EP2006/000696, filed on Jan. 26, 2006.

This patent application claims the priority of German patent application no. 10 2005 007 358.1 filed Feb. 17, 2005, the disclosure content of which is hereby incorporated by reference.

FIELD OF THE INVENTION

The present invention is directed to a light sensitive component with which even blue visible light can be detected sensitively and rapidly.

BACKGROUND OF THE INVENTION

Semiconductor components, for example photodiodes or phototransistors, can be used for detecting light. What is common to these components is that they have a pn junction around which a space charge zone forms which can be enlarged by means of a correspondingly applied external voltage. Light absorbed by the semiconductor body generates charge carriers pairs which are separated in the electric field of the space charge zone and forwarded to corresponding external contacts.

Silicon, for example, can be used as semiconductor material for light-sensitive semiconductor components, particularly if the components are integrated with integrated circuits. However, the absorption spectrum of silicon has an increasing absorption toward shorter-wave light. The consequence of this is that incident light in the range up to a wavelength of approximately 460 nm has only a small penetration depth into the silicon. This has the effect that said light is already almost completely absorbed in the semiconductor in a depth of approximately 80 nm. For the detection of such short-wave light, therefore, the semiconductor is only available up to this penetration depth.

What is disadvantageous about this fact is that known light-sensitive semiconductor components usually have a vertically oriented semiconductor junction and have a highly doped layer as topmost layer in order to realize the semiconductor junction. In this highly doped layer near the surface, however, charge carrier separation can only be effected with a reduced yield since, as a result of the high charge carrier concentration, the lifetime of the minority charge carriers is short and, on the other hand, the electric field of the space charge zone cannot extend over the entire highly doped layer, with the result that minority charge carriers generated there can pass to the corresponding current-delivering contact only by means of diffusion. However, this process is slow, increases the decay time of the photocurrent, and additionally increases the probability that charge carrier pairs will recombine and can therefore no longer contribute to the signal current of the component.

In order to increase the blue sensitivity of light-sensitive semiconductor components composed of silicon, various approaches have already been pursued. U.S. Pat. No. 4,107,722 A proposes producing, in a semiconductor body in a zone of the first conductivity type, a highly doped thin layer near the surface of the same conductivity type but with a different dopant. Alongside the actual semiconductor junction with a zone of the second conductivity type, a second semiconductor junction is produced in this way and generates a weak internal electric field that can additionally accelerate the charge carriers. However, said field is significantly smaller than the field that is formed in the space charge zone or applied externally to the space charge zone. Therefore, the charge separation speed is an order of magnitude lower than within the space charge zone. The consequence of this is that the component reacts to the incidence of light only sluggishly or requires a long decay phase until the last charge carrier pairs can be conducted away at the contacts.

U.S. Pat. No. 4,968,634 A discloses firstly producing a shallow doping in the surface of a semiconductor body and then etching the latter back as far as the location of the highest charge carrier concentration. This reduces the layer thickness of the highly doped layer and reduces the proportion of charge carrier pairs generated in said layer.

What is common to most of the approaches for increasing the blue sensitivity of semiconductor components is that they either have a reduced light sensitivity and/or require a long decay time, which make the components slow. Such components are not suitable for the sensitive detection of light pulses with high pulse rates.

SUMMARY OF THE INVENTION

It is an object of the present invention to specify a light-sensitive component with which even blue visible light can be detected sensitively and rapidly.

This and other objects are attained in accordance with one aspect of the present invention directed to a light-sensitive component comprising a semiconductor body; a first region of the first conductivity type; a second region of the second conductivity type, said second region being formed adjacent to the first region; and a gate electrode, which is electrically insulated from the semiconductor body and which is arranged adjacent to the second region above the first region; wherein said first and second regions adjoin the surface of the semiconductor body, and wherein said gate electrode is transmissive to visible light.

A basic idea of the invention is to utilize the layer of CMOS-like structures that lies below the inversion zone for the absorption of short-wave light quanta and to conduct away the generated charge carriers essentially horizontally within said inversion zone to corresponding contacts lying outside said inversion zone. The inversion zone is generated with the aid of an insulated gate electrode, to which a corresponding voltage is applied. Since the gate electrode is arranged above the inversion zone on the light incidence side of the component, provision is made for configuring the gate electrode such that it is at least partly transparent to the incident light. This is achieved according to the present invention by virtue of the fact that either the gate electrode is composed of a transparent conductive material or alternatively a gap for light incidence is provided in or alongside the gate electrode, e.g. in the form of two or more structures which are separated by a gap and between which light incidence is possible as far as the semiconductor body under the inversion zone, where a space charge zone encompassing the inversion zone is formed in the component. In the most general case, a "gap" on both sides of or around a gate electrode formed e.g. as an individual strip is also sufficient.

The light-sensitive component proposed therefore has a semiconductor body, in which a second region of the second conductivity type is formed near the surface in a first region of the first conductivity type, in which a gate electrode electrically insulated from the semiconductor is arranged adjacent to the second region above the first region, and in which the gate electrode is formed such that it is transmissive to visible light.

The first and second regions can be produced in the semiconductor body by means of doping. However, it is also possible for the semiconductor body to have a doping of the first conductivity type and for the second region to be produced subsequently e.g. by implantation or other doping methods in a part of the first region. The first region is preferably weakly doped.

The inversion zone is formed in a zone adjoining the surface of the semiconductor body within the first region by means of an electrical potential that has the same charge or polarity as the majority charge carriers of the first region being applied to the gate electrode. The inversion zone reaches horizontally at least as far as the adjoining second region, which in analogous correspondence—relative to CMOS-like structures—corresponds to a source/drain zone. The second region is preferably highly doped.

An electrical voltage can be applied via an electrical contact at the second region and a further contact, which is electrically conductively connected to the first region, with the result that the charge carriers generated in the space charge zone of the first region are separated.

In one embodiment, the second region is formed as a ring-shapedly doped and e.g. implanted zone that encloses the first region provided for forming the inversion zone. The entire ring-shaped second region can thus be connected to the same potential. The second contact for applying the electric field is led outside the ring-shaped second region to the semiconductor body, which there has the same doping as the first region.

Charge carriers of the first conductivity type can be conducted away with low impedance and thus with low losses e.g. by means of a buried layer that has a high doping of the first conductivity type and is arranged at least below the second region and the inversion zone. Said buried layer, with a high doping introduced as sinker, can be connected with low losses to a surface contact outside the zone enclosed by the second region.

A gate electrode formed by way of example comprises at least two strips of polysilicon which are parallel to one another, which represent the "gate" and between which a gap is formed. However, for the component itself, all other electrode materials and in particular e.g. metals are also suitable, of course. The one or a plurality of strip structures are preferably formed with minimal structure width in order to minimize the shading by the gate electrode. By contrast, the gap between or alongside the structures is set to a maximum size, but under the boundary condition that the inversion zone is also closed below the gap or reaches horizontally as far as the second region. An excessively large gap between two gate structures produces an interruption in the inversion zone, which is disadvantageous for the component.

The gap between or alongside the gate structures can be enlarged without any interruption in the inversion zone if the insulating layer between the surface of the semiconductor body and the gate electrode is formed in a correspondingly thicker fashion. It is also possible to compensate for the gap by means of a higher control voltage connected to the gate electrode. A patterned gate electrode is preferably formed above a gate dielectric which is formed in a thicker fashion by comparison with a CMOS structure and comprises a field oxide, for example. With a distance between the gate structures of e.g. 0.5 to 3 µm, a closed inversion zone can be obtained with customary voltages. However, it is also possible to further increase the gap between the structures by means of a corresponding further increase in the thickness of the gate dielectric or by means of a further increase in the control voltage present at the gate electrode, without disadvantages for the function of the component.

What is unproblematic in this regard is a gate electrode which is composed of a transparent electrically conductive material, e.g. a conductive oxide (TCO) such as ITO (indium tin oxide), for example, and can therefore be used in an unperforated fashion. These gate materials guarantee undisturbed light incidence into the inversion zone of the component and hence a high sensitivity. With a transparent gate electrode, it is possible to produce a large-area component which likewise has a high sensitivity especially in the range of short-wave light (blue visible light). Since, with a continuous gate electrode composed of transparent conductive material, it is also not necessary to bridge gaps of a gate structure for generating a continuous inversion zone, the control voltage to be applied at the gate electrode can be chosen to be lower than in the other exemplary embodiment.

The component has a semiconductor body with a suitable band gap. By way of example, silicon or silicon-germanium alloys and also germanium itself are highly suitable alongside other elemental or compound semiconductors. It is also possible to use a strained silicon layer for the topmost layer of the semiconductor body, said strained silicon layer having a lowered band gap by comparison with silicon.

A further improvement in the light sensitivity of components according to an embodiment of the invention is obtained if the semiconductor body has an antireflective coating. Such a coating can have one or a plurality of layers transparent to the light to be detected and having a relative layer thickness of a quarter of the optical wavelength of the light to be detected. In a layer whose relative layer thickness is approximately a quarter of the optical wavelength of the light that can propagate therein, the reflected light is extinguished as a result of destructive interference. Since 100% extinction can be set with a layer only for exactly one wavelength, a plurality of such quarter-wave layers are necessary for antireflective properties over a larger wavelength range. The antireflective coating can be arranged directly on the semiconductor body below the gate dielectric or form the topmost layer of the component.

The assignment of the conductivity types to the first and second regions is unimportant for the properties of the component. Thus, it is possible to produce the light-sensitive component with an inversion zone having an n-channel in analogous correspondence, and which corresponds to a depletion-mode MOS transistor. However, it is also possible to produce a p-channel in the inversion zone, which corresponds to an enhancement-mode MOS transistor. N-channel means in this case that the minority charge carriers in a p-doped first region determine the conductivity and thus invert the original conductivity impressed by the majority charge carriers. An n-channel inversion zone is therefore formed in a p-conducting semiconductor body and has electrons as free charge carriers. In order to displace the majority charge carriers, that is to say the holes, into the semiconductor body, a positive potential is applied to the gate electrode. For the p-channel, the conditions are analogous but with opposite signs.

The invention is explained in more detail below on the basis of exemplary embodiments and the associated figures. The figures serve solely to afford a better understanding of the invention and have therefore only been drawn up schematically and not as true to scale. Identical or identically acting parts are designated by identical reference symbols.

BRIEF DESCRIPTION OF THE DRAWINGS

FIG. 1 shows a first light-sensitive component in schematic cross section;

FIG. 2 shows a second light-sensitive component in schematic cross section;

DETAILED DESCRIPTION OF THE DRAWINGS

Figure 3:
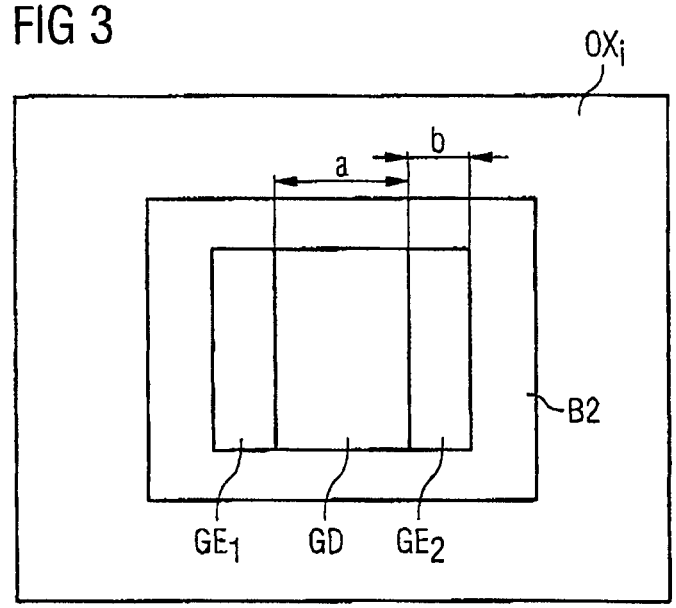
FIG. 3 shows an exemplary gate structure.

FIG. 1 shows a first embodiment for a light-sensitive component in schematic cross section. The component is constructed on a semiconductor body HL, for example a silicon wafer. The semiconductor body has a doping of the first conductivity type, here for example a p-type doping, for example a weak boron doping within the range of $10^{13}$ to $10^{16}$ cm$^{-3}$, at least in a first region B1. A relatively thick gate dielectric, for example a grown field oxide, is applied above the first region B1. Arranged on the gate dielectric is the gate electrode GE, for example a thin layer of thin conductive oxide, for example indium tin oxide, ITO. In the illustration on both sides of the gate dielectric GD, that is to say horizontally adjoining the first region adjoining below the gate dielectric, second regions B2 of the second conductivity type are formed in the surface of the semiconductor body. The doping of the second regions is shallow, while the first region B1 here is formed by the semiconductor body HL. An inner oxide $OX_i$ is formed, in a strip-type shape to surround the second region B2 and encloses the active region of the component. A third doped region KD, which serves as a substrate connection, is provided outside the inner oxide $OX_i$. Accordingly, the third doped region has a high doping of the first conductivity type. An outer oxide $OX_a$ for example likewise a field oxide, is provided further outside and also formed in a strip-type shape to surround the component. A first contact K1 serves for the electrical connection of the second region B2 and a second contact K2 serves for the connection of the semiconductor body HL or of the first region B1 being provided therein.

Preferably, the first region B1 extends over the entire semiconductor body HL, the highly doped second region and the highly doped third region being implanted into said semiconductor body HL. However, it is also possible to produce the highly doped second and third regions with the aid of doping techniques that differ from this, for example by diffusion or by drive-in of dopant from a corresponding dopant source.

A third contact (not illustrated in the figure) is connected to the gate electrode GE and serves to apply to the latter a corresponding potential, corresponding to a control voltage. In the exemplary embodiment illustrated, in which the semiconductor body HL and thus the first region B1 is of the first conductivity type P-conducting, a control voltage within the range of +0.5 to +30 V can be chosen, the magnitude of the voltage determining the concentration of the charge carriers in the inversion zone. This positive potential has the effect that in the semiconductor body HL below the gate electrode GE, the majority charge carriers (holes) are forced into the substrate, so that only minority charge carriers (electrons) remain within a relatively thin inversion zone IZ directly at the surface of the semiconductor body. The inversion zone IZ therefore has n-conduction; the original conductivity type of the semiconductor body HL is inverted. The deeper reaching space charge zone forms together with the inversion zone, but the size of said space charge zone is not determined by the voltage present at the gate electrode GE, but rather by the voltage applied between the first and second contacts.

A light incident through the transparent gate electrode GE and the likewise transparent field oxide serving as gate electrode GD then penetrates into the semiconductor body, the light being absorbed at varying depth according to its wavelength. Short-wave blue light is already almost completely absorbed within a layer thickness of approximately 80 nm. The space charge zone is advantageously formed, by a corresponding choice of the voltage between the first and second contacts, as far as a depth such that the light quanta of the desired wavelength that are to be detected are completely absorbed within the space charge zone. Charge carrier pairs arise during the absorption and are separated in the field of the space charge zone below the gate dielectric. The majority charge carriers are accumulated at the third doped region KD and the contact K2 connected thereto. The electric field of the space charge zone can be amplified by means of a transport voltage applied between K1 and K2, which accelerates the drift of the charge carriers. However, at a field of approximately $10^5$ V/cm a saturation velocity is reached which can no longer be increased by even higher field strengths.

FIG. 2 shows a further exemplary embodiment for a light-sensitive component, in which the gate electrode GE comprises two structures separated from one another by a gap. The gate dielectric GD is uncovered between the two structures GE1, GE2. The gate electrode GE is patterned for example into narrow strips parallel to one another, at least two, but preferably a plurality of strips parallel to one another being provided. For the rest of the construction, the component in accordance with the second exemplary embodiment corresponds to that of the first exemplary embodiment.

Here, too, a control voltage is applied to the two structures of the gate electrode GE. For this purpose, the two structures can be electrically connected to one another. However, it is also possible for the same potential to be applied to both gate electrode structures GE1, GE2 separately from one another. In contrast to the first exemplary embodiment, here the gate dielectric GD is made thicker in order that the inversion zones that form actually only below the structures of the gate electrodes can nevertheless overlap correspondingly and form a single inversion zone IZ that is continuous over all the gate structures. An overlap to form a uniform inversion zone IZ takes place if the gate dielectric has a specific minimum thickness for a given control voltage and a given distance between the structures.

FIG. 3 shows the second exemplary embodiment in an exemplary plan view. It becomes clear from the figure that the gate electrode GE is formed from two strips GE1, GE2, which are parallel to one another and which enclose a gap having the width A between them. The width B of the structures GE1, GE2 is set in minimal fashion depending on the patterning technique used. With a minimal width B and a maximal distance A, the ratio between non-shaded gate dielectric GD and regions shaded by the gate electrode GE becomes maximal, with the result that, in the region of the gate electrode, a maximal proportion of the incident light can penetrate into the semiconductor body GE between the two structures of the gate electrode. The gate region defined by the strip-type gate electrodes GE1, GE2 is surrounded by second region B2 having a doping of the second conductivity type. The second region B2 can be a rectangular strip-type shape as shown in FIG. 3, or it can be curved into more of a circular-type shape.

Besides the depicted configuration, it is additionally possible to permit the second region B2 to adjoin the gate electrode only on one side or to provide the second region at two mutually opposite sides of the gate electrode. In this case, the component can then be connected up like a CMOS transistor with source and drain, in which case the photocurrent generated can then flow between the two mutually opposite second regions. If said transistor is then operated in the sub threshold range, even a small light signal brings about a large current change. Two second regions which are spatially separate from one another and which adjoin the gate electrode GE at the top and at the bottom in FIG. 3 are advantageous in the last-mentioned case. It is ensured in this way that the charge carrier transport toward the second region B2 runs parallel to the strip-type structures of the gate electrode and thus runs along a homogenous inversion zone IZ.

In the example illustrated, the second region B2 in turn is surrounded by a superficial insulating zone, for example inner oxide region $OX_i$. The third doped region provided with the second contact K2 is provided (not illustrated in the figure) outside the inner oxide region $OX_i$, the electrical connection of the semiconductor body being effected via said third doped region.

Figure 4:
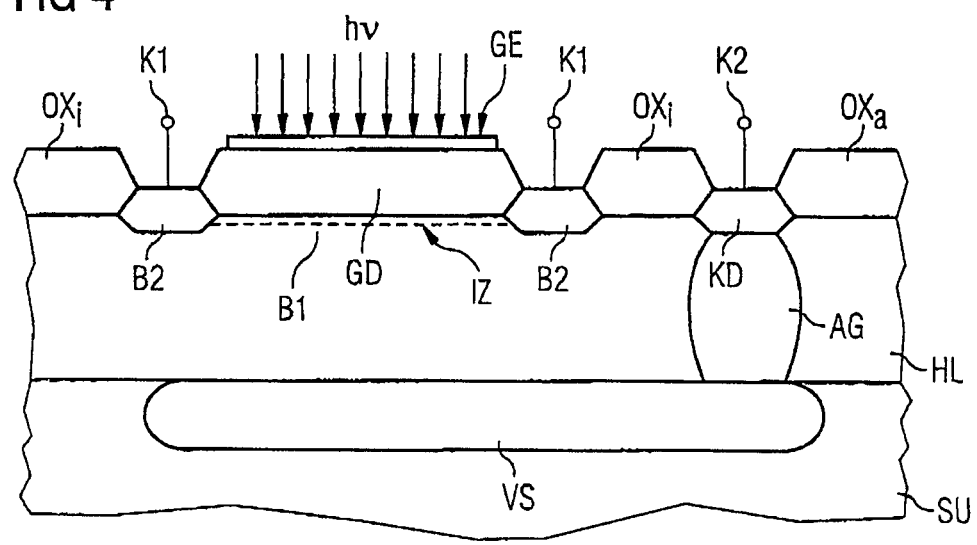
FIG. 4 shows the contact-connection of the component by means of a buried layer.

FIG. 4 shows a further configuration for a light-sensitive component, which can be combined with the embodiments in accordance with FIGS. 1 and 2. In a departure from the homogeneously doped semiconductor body HL used in the first two exemplary embodiments, a buried layer VS is provided in the embodiment according to FIG. 4. Said buried layer is produced for example by implantation of a dopant of the first conductivity type into a semiconductor substrate SU. Afterward, an epitaxial doped semiconductor layer, corresponding to the semiconductor body HL of the first two exemplary embodiments, is deposited over that. Afterward, the dopant implanted in the substrate is activated by a thermal treatment, whereby the buried layer VS is obtained to have an increased doping intensity by comparison with the semiconductor body HL. By means of a likewise highly doped connection zone AG formed as a sinker, the buried layer VS is connected to the third doped region KD with low impedance. In this way, the corresponding (majority) charge carriers can be carried away with low impedance. Such a low-impedance contact composed of buried layer VS and highly doped connection zone AG can be embodied in the manner known in bipolar technology, where it is used as a collector connection. The remaining structures of the light-sensitive components are compatible with CMOS technology and can be produced using standard methods and standard devices of CMOS technology.

In a further variant, which is equivalent to the buried layer VS illustrated in FIG. 4, a highly doped zone of the first conductivity type is produced below the first region by means of a high-energy implantation in a desired depth. The implantation energy guarantees that the doping takes effect exclusively in the desired depth of 1 to 2 μm, for example, a deeply situated or buried low-impedance connection of the first region likewise being produced. The electrical connection of this implanted deeply situated zone to the surface or to the second contact K2 can likewise be effected via a connection zone AG.

Figure 5:
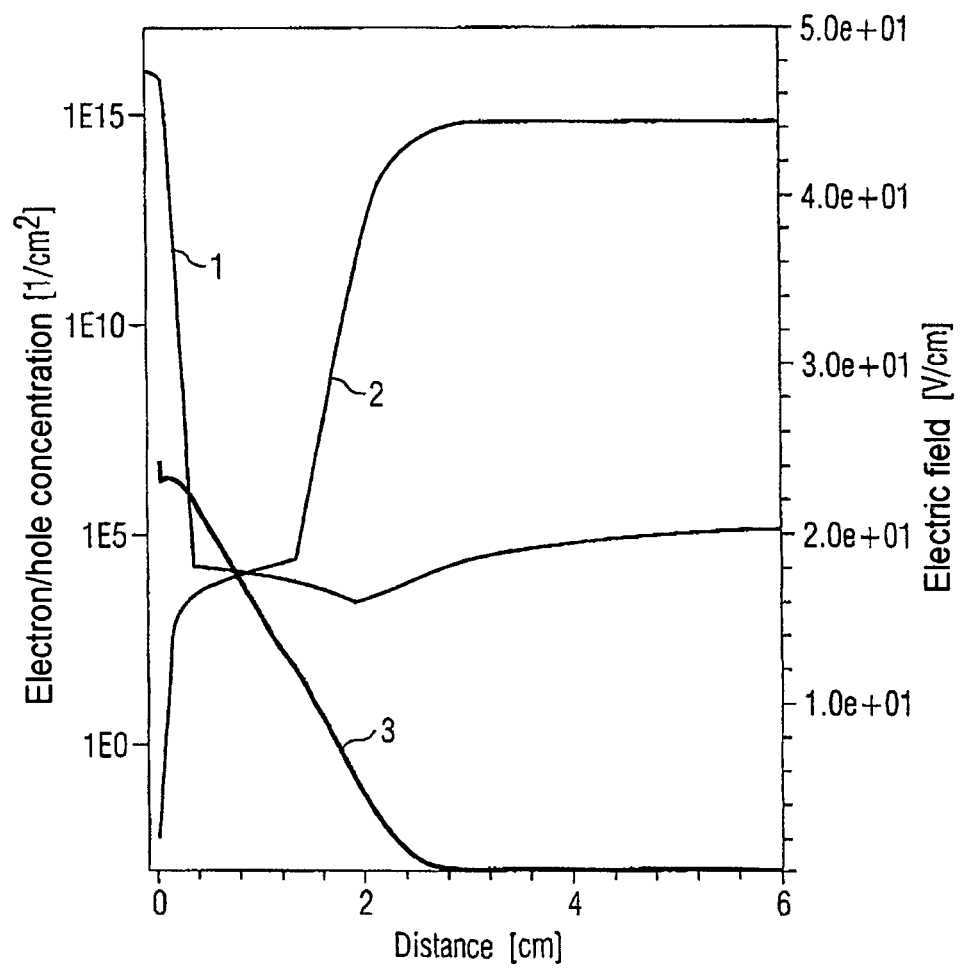
FIG. 5 shows the charge carrier distribution and the field density in a component.

FIG. 5 illustrates on the basis of a diagram the concentration of the two charge carrier types within the semiconductor body as a function of the distance from the surface in a logarithmic plot. Curve 1 indicates the concentration of the minority charge carriers, that is to say of the electrons in a p-doped zone. Curve 2 shows the concentration of the majority charge carriers, that is to say of the holes in the exemplary embodiment chosen. It is evident that the concentration of minority charge carriers and majority charge carriers is inverted, so that the minority charge carriers are predominant near the surface. In a depth dependent on the applied external potential, the inversion is reversed, so that normal states prevail within the p-doped semiconductor body and the majority charge carriers are predominant here over the minority charge carriers and mediate the conductivity.

Curve 3, which is likewise illustrated in FIG. 5, indicates the profile of the electric field as a function of the distance from the surface of the semiconductor body, in which case the corresponding value of the electric field can be read on the right-hand ordinate. It is evident that the electric field has a maximum value directly at the surface and falls approximately linearly with increasing depth.

The precise value of the structure parameters used in a light-sensitive component can be determined by means of simulation calculations. In particular, in the second exemplary embodiment, this is the width a of the gap between the two strip structures of the gate electrode GE, which can be chosen between 0.5 and 4 μm given a thickness of the gate dielectric GD of approximately 0.4 μm, in which case a continuous inversion zone can nevertheless be obtained even in the region below the gap.

The light-sensitive component proposed may constitute an individual detector for detecting in particular short-wave visible light. It is also possible to configure from the proposed individual detector a detector array, in which a plurality of detectors are ordered in a manner distributed uniformly over an area and can be read separately. In this way, it is possible to detect an incident radiation which has a varying intensity distributed over the area of incidence, thus imaging an image-like structure, correspondingly in the detector array, the photocurrents flowing between contacts K1 and K2 representing a measure of the quantity of the incident light or the number of incident light quanta. The photo detector proposed is suitable in particular for detecting radiation having a wavelength of less than 460 nm, which other photo detectors can detect only with difficulty or with low sensitivity and low speed. The light-sensitive component proposed is therefore suitable in particular in combination with correspondingly short-wave light sources for information transmission. Such a photo detector can therefore advantageously be used for example in combination with a blue light emitting diode for optically scanning high-resolution structures such as are used for example in the new generation of digital storage media such as DVDs.

It is also possible to use the light-sensitive component for detecting light having other wavelengths, which can likewise be reliably detected by the component proposed. In contrast to the short-wave radiation, however, in this case the light quanta are absorbed at a greater distance from the surface of the semiconductor body HL and thus usually outside the space charge zone. If the thickness of the semiconductor body HL is chosen to be correspondingly large, then even longer-wave radiation can be absorbed exclusively in the lightly doped first region. A complete absorption of the light is achieved in silicon in the case of a wavelength-dependent layer thickness which is approximately 4 μm for red light up to a wavelength of 650 nm. Even longer-wave light requires even larger layer thicknesses for complete absorption. Accordingly, in the embodiments with deeply situated highly doped regions such as, for example, the buried layer VS or the deep-implanted region, a corresponding layer thickness of the overlaying lightly doped zone of the semiconductor body is ensured.

The invention is not restricted to the exemplary embodiments presented. It also lies within the scope of the invention, in the case of nontransparent gate materials, to perform the patterning of the gate electrode differently and, in particular, to provide a larger number of strips parallel to one another. It is also possible to form the non-shaded regions between the structures of the patterned gate electrode e.g. in rectangular fashion and for this purpose to pattern a gate electrode. It is also possible to produce, in a planar gate electrode, a regular pattern of perforations in which the semiconductor body is not shaded by the gate electrode. Moreover, the invention is not limited to the materials proposed. Thus, the gate electrode can be produced from any desired materials, but preferably from polysilicon. The first and second contacts can likewise be produced by metallic coating over the highly doped regions, preferably likewise again by means of standard metallizations such as aluminum. The two-dimensional arrangement of first and second region and also of first and second contact and also of buried layer and connection zone can be varied as desired. Preference is given, however, to those arrangements which are formed with the lowest possible impedance on account of the small distances to be overcome and the doping intensity of the structures used for conducting away current.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A light-sensitive component comprising:
   a semiconductor body;
   a first region of a first conductivity type, the first region adjoining a surface of the semiconductor body;
   a second region of a second conductivity type being opposite the first conductivity type, the second region adjoining the surface of the semiconductor body and being formed adjacent to the first region; and
   a gate electrode which is electrically insulated from the semiconductor body by an insulating gate dielectric, the gate electrode being arranged adjacent to the second region and above the first region,
   wherein the gate electrode is formed directly on the insulating gate dielectric transparent to visible light, the gate electrode having at least two structures separated from one another by a gap, such that the gate dielectric is uncovered in the gap, and the first region extends under the structures of the gate electrode and under the gap of the gate electrode, wherein the at least two structures are electrically connected to one another by material selected such that no potential difference or voltage drop exists between the at least two structures,
   wherein the semiconductor body has a low doping of the first conductivity type and the second region is embedded in the semiconductor body, and
   wherein a first contact to the second region and a second contact to the first region are formed at the surface of the semiconductor body.

2. The component as claimed in claim 1, in which the separated structures of the gate electrode comprise at least two strips parallel to one another.

3. The component as claimed in claim 1, in which the second region is a closed doping zone in the semiconductor body that surrounds the first region.

4. The component as claimed in claim 1, in which the control voltage is chosen, depending on a thickness of the insulating gate dielectric, with a magnitude such that a closed inversion zone reaching as far as the second region is formed in a zone near a surface of the first region below the gate electrode, charge carriers of the minority type predominating in said inversion zone.

5. The component as claimed in claim 1, in which the semiconductor body comprises Si or SiGe.

6. The component as claimed in claim 1, in which the doping of the first conductivity type in the first region has a gradient, wherein an intensity of the doping increases with increasing distance from the surface.

7. The component as claimed in claim 1, wherein the second contact is connected to the first region through a highly-doped third region.

8. The component as claimed in claim 1, wherein the gate dielectric extends continuously across the gap.

9. The component as claimed in claim 1, wherein the second region is located lateral to a region overlaid by the gate electrode and the gap of the gate electrode.

* * * * *